(12) United States Patent
Choi et al.

(10) Patent No.: US 10,069,106 B2
(45) Date of Patent: Sep. 4, 2018

(54) ORGANIC LIGHT-EMITTING DISPLAY APPARATUS WITH A FLEXIBLE FILM AND METHOD OF MANUFACTURING THE SAME

(71) Applicant: Samsung Display Co., Ltd., Yongin-Si, Gyeonggi-Do (KR)

(72) Inventors: Kwanghyuk Choi, Yongin (KR); Chung Yi, Yongin (KR); Hyunjoon Kim, Yongin (KR); Hyeyoung Gim, Yongin (KR); Sanghun Oh, Yongin (KR); Sungkyung Jun, Yongin (KR); Gyoochul Jo, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/927,240

(22) Filed: Oct. 29, 2015

(65) Prior Publication Data

US 2016/0190511 A1 Jun. 30, 2016

(30) Foreign Application Priority Data

Dec. 30, 2014 (KR) ........................ 10-2014-0193937

(51) Int. Cl.
*H01L 27/32* (2006.01)
*H01L 51/52* (2006.01)
*H01L 51/00* (2006.01)

(52) U.S. Cl.
CPC ...... *H01L 51/5253* (2013.01); *H01L 27/3244* (2013.01); *H01L 51/003* (2013.01); *H01L 2227/326* (2013.01)

(58) Field of Classification Search
CPC . H01L 27/32; H01L 27/3209; H01L 27/3225; H01L 27/3251; H01L 27/3258; H01L 2227/32; H01L 2924/12044; H01L 23/4985; H01L 23/5387
See application file for complete search history.

(56) References Cited

U.S. PATENT DOCUMENTS

| | | | |
|---|---|---|---|
| 2013/0032830 A1 | 2/2013 | Lee et al. | |
| 2013/0069045 A1* | 3/2013 | Otsuki | H01L 27/1225 257/40 |
| 2014/0138640 A1 | 5/2014 | Kim et al. | |
| 2015/0188079 A1* | 7/2015 | Kang | H01L 51/5259 257/40 |
| 2016/0165735 A1* | 6/2016 | Akasaka | B24B 37/042 451/41 |
| 2016/0285017 A1* | 9/2016 | Liu | H01L 51/52 |

FOREIGN PATENT DOCUMENTS

| | | |
|---|---|---|
| KR | 10-2009-0047885 A | 5/2009 |
| KR | 10-2010-0124009 A | 11/2010 |
| KR | 10-2011-0101518 A | 9/2011 |

(Continued)

*Primary Examiner* — Hoai V Pham
(74) *Attorney, Agent, or Firm* — Knobbe Martens Olson & Bear LLP

(57) ABSTRACT

An organic light-emitting display apparatus includes a lower substrate, an organic light-emitting device on the lower substrate, and a flexible film below the lower substrate, wherein the flexible film includes a base and a second barrier layer provided on the base to prevent infiltration of moisture and oxygen.

9 Claims, 5 Drawing Sheets

(56) References Cited

FOREIGN PATENT DOCUMENTS

| KR | 10-2011-0137217 A | 12/2011 |
|---|---|---|
| KR | 10-2012-0010888 A | 2/2012 |
| KR | 10-2012-0046427 A | 5/2012 |
| KR | 10-2013-0016042 A | 2/2013 |
| KR | 10-2014-0000440 A | 1/2014 |
| KR | 10-2014-0064481 | 5/2014 |

* cited by examiner

ORGANIC LIGHT-EMITTING DISPLAY APPARATUS WITH A FLEXIBLE FILM AND METHOD OF MANUFACTURING THE SAME

RELATED APPLICATION

This application claims the benefit of Korean Patent Application No. 10-2014-0193937, filed on Dec. 30, 2014, in the Korean Intellectual Property Office, the disclosure of which is incorporated herein in its entirety by reference.

BACKGROUND

Field

One or more example embodiments relate to an organic light-emitting display apparatus and a method of manufacturing the same.

Description of the Related Art

Organic light-emitting display apparatuses are self-emission display apparatuses which have an organic light-emitting device including a hole injection electrode, an electron injection electrode, and an organic emission layer formed between the hole injection electrode and the electron injection electrode and emit light when excitons generated by holes injected from the hole injection electrode and electrons injected from the electron injection electrode inside the organic emission layer drop from an excited state to a ground state.

As organic light-emitting display apparatuses have self-emitting characteristics, they do not require a separate light source. Thus, the organic light-emitting display apparatuses may be driven at a low voltage, be lightweight and thin, and have high-quality characteristics such as wide view angles, good contrast, and quick response times. Accordingly, such apparatuses have drawn attention as next-generation display apparatuses.

SUMMARY

One or more example embodiments include an organic light-emitting display apparatus and a method of manufacturing the same.

Additional aspects will be set forth in part in the description which follows and, in part, will be apparent from the description, or may be learned by practice of the presented embodiments.

According to one or more example embodiments, an organic light-emitting display apparatus includes: a lower substrate; an organic light-emitting device on the lower substrate; and a flexible film below the lower substrate, wherein the flexible film includes: a base; and a second barrier layer provided on the base to prevent infiltration of moisture and oxygen.

The second barrier layer may comprise metal nitride, metal oxide, an inorganic material, or a metal thin-film.

The second barrier layer may comprise at least two of metal nitride, metal oxide, an inorganic material, and a metal thin-film and formed as two or more thin-film layers.

The second barrier layer may comprise aluminum oxide ($AlO_x$), titanium oxide ($TiO_x$), silicon oxide ($SiO_x$), aluminum nitride ($AlN_x$), aluminum oxynitride (AlON), titanium nitride ($TiN_x$), titanium oxynitride ($TiON_x$), silicon nitride ($SiN_x$), silicon oxynitride ($SiON_x$), Al, Ti, molybdenum (Mo), silver (Ag), copper (Cu), iron (Fe), chromium (Cr), nickel (Ni), zinc (Zn), or tin (Sn).

The second barrier layer may have a thickness of about 100 μm or less.

The flexible film may include an adhesive layer on the second barrier layer.

The adhesive layer may include a permanent or temporary adhesive having a function of preventing infiltration of moisture and oxygen.

The organic light-emitting display apparatus may further include a first barrier layer between the lower substrate and the organic light-emitting device.

The first barrier layer may comprise metal nitride, metal oxide, an inorganic material, or a metal thin-film.

The first barrier layer may comprise $AlO_x$, $TiO_x$, $SiO_x$, $AlN_x$, AlON, $TiN_x$, $TiON_x$, $SiN_x$, $SiON_x$, Al, Ti, Mo, Ag, Cu, Fe, Cr, Ni, Zn, or Sn.

The base may comprise a polymer.

The base may comprise polyethylene terephthalate (PET), polyimide (PI), polycarbonate (PC), polyethylene naphthalate (PEN), or polyethersulfone (PES).

According to one or more embodiments, a method of manufacturing an organic light-emitting display apparatus includes: sequentially stacking a lower substrate and an organic light-emitting device on a mother substrate; separating the mother substrate from the lower substrate through an excimer laser peel-off (ELP) process; forming a flexible film by sequentially stacking a second barrier layer and an adhesive layer on a separate base; and attaching the flexible film below the lower substrate.

The second barrier layer may comprise metal nitride, metal oxide, an inorganic material, or a metal thin-film.

The second barrier layer may comprise at least two of metal nitride, metal oxide, an inorganic material, and a metal thin-film and formed as two or more thin-film layers.

The second barrier layer may comprise aluminum oxide ($AlO_x$), titanium oxide ($TiO_x$), silicon oxide ($SiO_x$), aluminum nitride ($AlN_x$), aluminum oxynitride (AlON), titanium nitride ($TiN_x$), titanium oxynitride ($TiON_x$), silicon nitride ($SiN_x$), silicon oxynitride ($SiON_x$), Al, Ti, molybdenum (Mo), silver (Ag), copper (Cu), iron (Fe), chromium (Cr), nickel (Ni), zinc (Zn), or tin (Sn).

The second barrier layer may have a thickness of about 100 μm or less.

The second barrier layer may be stacked on the base by performing a physical vapor deposition (PVD) method, a chemical vapor deposition (CVD) method, a wet thin-film forming method, or a sheet bonding process.

The adhesive layer may include a permanent or temporary adhesive having a function of preventing infiltration of moisture and oxygen.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
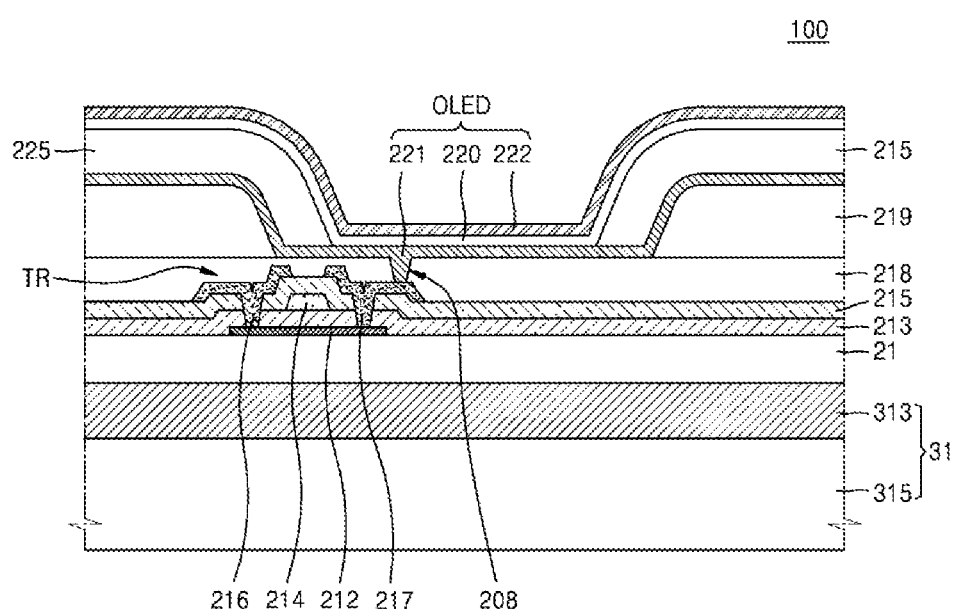
FIG. 1 illustrates a cross-sectional view of an organic light-emitting display apparatus according to an embodiment.

Reference will now be made in detail to embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description.

It will be understood that although the terms "first," "second," etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components.

As used herein, the term "and/or" includes any and all combinations of one or more of the associated listed items. Expressions such as "at least one of," when preceding a list of elements, modify the entire list of elements and do not modify the individual elements of the list.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

Hereinafter, embodiments will be described with reference to the accompanying drawings.

Figure 2:
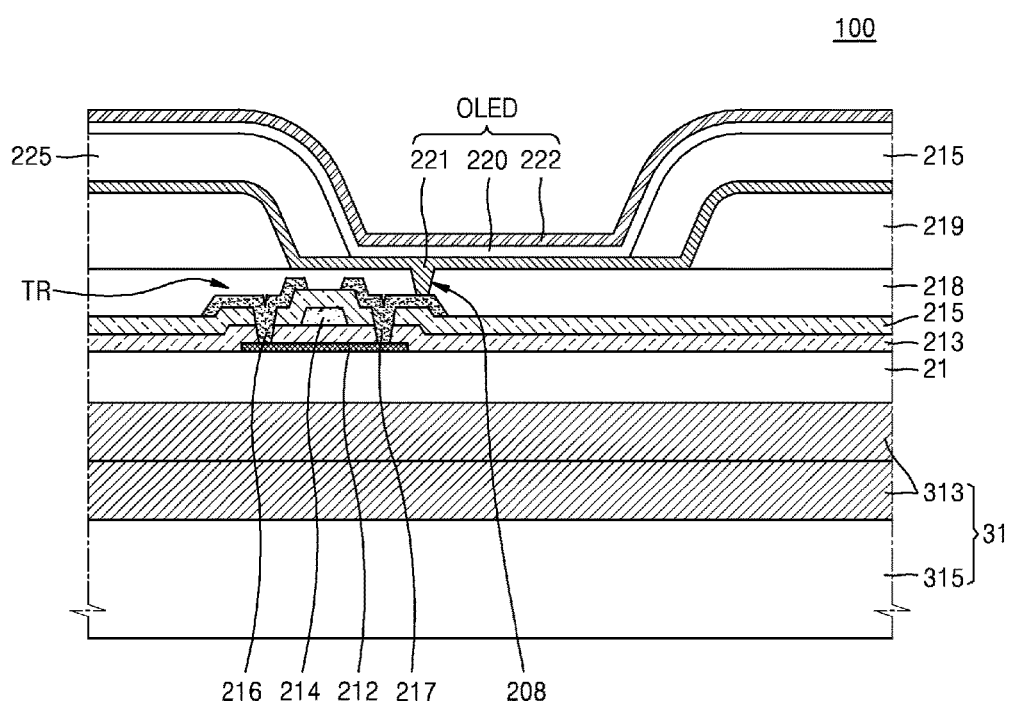
FIG. 2 illustrates a cross-sectional view of an organic light-emitting display apparatus according to another embodiment.

FIG. 1 illustrates a cross-sectional view of an organic light-emitting display apparatus 100 according to an embodiment, and FIG. 2 illustrates a cross-sectional view of the organic light-emitting display apparatus 100 according to another embodiment.

Referring to FIG. 1, the organic light-emitting display apparatus 100 may include a flexible film 31, a lower substrate 21, a thin-film transistor TR, a planarization layer 218, an insulating layer 219, an organic light-emitting device OLED, and a pixel-defining layer 225.

Although FIG. 1 shows that the flexible film 31 is provided only below the lower substrate 21 and devices are formed immediately on the lower substrate 21, this is merely illustrative, and the present embodiment is not limited thereto.

The lower substrate 21 may be formed in a single form, and various components such as a polyester film may be provided on the lower substrate 21 according to circumstances. According to one or more embodiments, the lower substrate 21 may be formed of one layer.

The lower substrate 21 may comprise a transparent glass material having $SiO_2$ as a main component. However, the lower substrate 21 is not necessarily limited thereto, and various materials such as a ceramic material, a transparent plastic material, and a transparent metallic material may be used.

According to one or more embodiments, the lower substrate 21 may comprise a polymer such as polyethylene terephthalate (PET), polyimide (PI), polycarbonate (PC), polyethylene naphthalate (PEN), or polyethersulfone (PES). However, materials of the lower substrate 21 are not limited thereto.

The flexible film 31 may be provided below the lower substrate 21 and may include a base 315 and a second barrier layer 313.

The flexible film 31 may be provided below the lower substrate 21 to prevent infiltration of moisture and oxygen into the organic light-emitting device OLED on the lower substrate 21. Also, with the flexible film 31, the lower substrate 21 and the organic light-emitting device OLED having flexibility may be bent when the organic light-emitting display apparatus 100 is used as a flexible display.

The flexible film 31 may be formed by stacking the second barrier layer 313 on the base 315.

The base 315 is a substrate as the lowest layer of the flexible film 31 and may comprise a polymer. According to one or more embodiments, the base 315 may comprise a polymer such as polyethylene terephthalate (PET), polyimide (PI), polycarbonate (PC), polyethylene naphthalate (PEN), or polyethersulfone (PES). However, materials of the base 315 are not limited thereto.

The second barrier layer 313 which can prevent infiltration of moisture and oxygen into the organic light-emitting device OLED may be provided on the base 315 as described above.

In the organic light-emitting display apparatus 100 according to the present embodiment, the flexible film 31 is formed with the second barrier layer 313, and thus, a separate substrate is not required below the organic light-emitting device OLED. Since the second barrier layer 313 is included in the flexible film 31 below the lower substrate 21, the organic light-emitting display apparatus 100 according to the present embodiment may include only the lower substrate 21 below the organic light-emitting device OLED.

In other words, according to the related art, a separate lower substrate has to be provided below the organic light-emitting device OLED to prevent infiltration of moisture and oxygen into the organic light-emitting device OLED. However, the organic light-emitting display apparatus 100 according to the present embodiment may be formed only with the lower substrate 21 without a separate lower substrate since the second barrier layer 313 is included in the flexible film 31 below the lower substrate 21 to prevent infiltration of moisture and oxygen into the organic light-emitting device OLED.

As a result, by forming the lower substrate 21, compared with a case where a separate lower substrate is provided, processing time and costs to be incurred may be reduced, and infiltration of moisture and oxygen may be effectively prevented.

The flexible film 31 according to an embodiment may have a thickness of about 50 μm to about 500 μm. However, these numeric values are merely examples, and the thickness of the flexible film 31 is not limited thereto.

In addition, the flexible film 31 according to an embodiment may prevent the infiltration of oxygen and moisture and have thus a water vapor transmission rate (WVTR) within a range of about $10^{-2}$ g/m$^2$ day to about $10^{-6}$ g/m$^2$ day.

The WVTR indicates the amount of moisture infiltrated per unit area a day, and as a value of the WVTR decreases, a rate of preventing infiltration of oxygen and moisture increases.

The flexible film 31 according to an embodiment may be formed so that a value of the WVTR is within a range of about $10^{-2}$ g/m$^2$ day to about $10^{-6}$ g/m$^2$ day.

The second barrier layer 313 may comprise metal nitride, metal oxide, an inorganic material, or a metal thin-film, as shown in FIG. 1.

According to one or more embodiments, the second barrier layer 313 may comprise aluminum oxide ($AlO_x$), titanium oxide ($TiO_x$), silicon oxide ($SiO_x$), aluminum nitride ($AlN_x$), aluminum oxynitride (AlON), titanium nitride ($TiN_x$), titanium oxynitride ($TiON_x$), silicon nitride ($SiN_x$), silicon oxynitride ($SiON_x$), Al, Ti, molybdenum (Mo), silver (Ag), copper (Cu), iron (Fe), chromium (Cr), nickel (Ni), zinc (Zn), or tin (Sn). However, materials of the second barrier layer 313 are not limited thereto.

The organic light-emitting display apparatus 100 according to another embodiment may include the second barrier layer 313, which is formed by two or more layers, as shown in FIG. 2. The second barrier layer 313 may be formed by stacking at least two of metal nitride, metal oxide, an inorganic material, and a metal thin-film and formed as two or more thin-film layers.

When the second barrier layer 313 is formed by stacking two or more layers, a path through which oxygen or moisture infiltrates is long, and thus, the infiltration of oxygen or moisture may be efficiently prevented.

According to the present embodiment, the second barrier layer 313 may be formed by stacking two or more layers, each layer including at least one selected from the group consisting of $AlO_x$, $TiO_x$, $SiO_x$, $AlN_x$, AlON, $TiN_x$, $TiON_x$, $SiN_x$, $SiON_x$, Al, Ti, Mo, Ag, Cu, Fe, Cr, Ni, Zn, and Sn. However, materials of the second barrier layer 313 are not limited thereto.

The second barrier layer 313 may have a thickness of about 100 μm or less. The second barrier layer 313 including a thin film layer may prevent infiltration of oxygen or moisture and simultaneously have flexibility so that the organic light-emitting display apparatus 100 is flexible.

If the second barrier layer 313 is too thick, the flexible characteristics of the organic light-emitting display apparatus 100 may degrade, and thus, the second barrier layer 313 may have a small thickness within a range capable of preventing infiltration of oxygen or moisture.

Therefore, the organic light-emitting display apparatus 100 according to the present embodiments may have a thickness of about 100 μm or less.

As described above, the organic light-emitting display apparatus 100 according to the present embodiments includes only one lower substrate 21 below the organic light-emitting device OLED, and thus, processing time and costs to be incurred may be reduced.

The transistor TR includes an active layer 212, a gate electrode 214, and source and drain electrodes 216 and 217. A gate insulating layer 213 is interposed between the gate electrode 214 and the active layer 212 to insulate the gate electrode 214 from the active layer 212.

The active layer 212 may be provided on the lower substrate 21. For the active layer 212, an inorganic semiconductor, such as amorphous silicon or polysilicon, or an organic semiconductor may be used. According to one or more embodiments, the active layer 212 may comprise an oxide semiconductor. For example, the oxide semiconductor may include a 12-, 13-, or 14-group metallic element, such as Zn, indium (In), gallium (Ga), Sn, cadmium (Cd), germanium (Ge), or hafnium (Hf), or an oxide of a material selected from a combination thereof.

The gate insulating layer 213 is provided on the lower substrate 21 and covers the active layer 212, and the gate electrode 214 is formed on the gate insulating layer 213.

The gate electrode 214 may include one or more metals selected from the group consisting of Mo, Al, platinum (Pt), palladium (Pd), Ag, magnesium (Mg), gold (Au), Ni, neodymium (Nd), iridium (Ir), Cr, lithium (Li), calcium (Ca), Ti, tungsten (W), and Cu.

An interlayer insulating layer 215 is formed on the gate insulating layer 213 such that the interlayer insulating layer 215 covers the gate electrode 214, and the source and drain electrodes 216 and 217 are formed on the interlayer insulating layer 215 and contact the active layer 212 through their respective contact holes.

The interlayer insulating layer 215 is formed all over the lower substrate 21 such that the interlayer insulating layer 215 covers the gate electrode 214.

The interlayer insulating layer 215 may comprise an inorganic or organic material. According to one or more embodiments, the interlayer insulating layer 215 may comprise an inorganic material. For example, the interlayer insulating layer 215 comprising metal oxide or metal nitride. In detail, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide $ZnO_2$), or the like. According to one or more embodiments, the interlayer insulating layer 215 may comprise a material having a dielectric constant of 4 to 7.

The interlayer insulating layer 215 may be a layer comprising inorganic materials such as $SiO_x$ and/or $SiN_x$ and formed as a single layer or layers. According to one or more embodiments, the interlayer insulating layer 215 may be formed in a double-layer structure of $SiO_x/SiN_y$ or $SiN_x/SiO_y$.

The structure of the thin-film transistor TR described above is not necessarily limited thereto, and various types of thin-film transistor structures may be used. For example, although the thin-film transistor TR has a top gate structure, the thin-film transistor TR may have a bottom gate structure in which the gate electrode 214 is disposed below the active layer 212.

A pixel circuit (not shown) including the thin-film transistor TR and a capacitor (not shown) may be formed.

The planarization layer 218 is provided on the interlayer insulating layer 215 and covers the thin-film transistor TR. The planarization layer 218 may remove a layer level difference and planarize a surface to increase the emission efficiency of an organic light-emitting device OLED to be formed thereon. In addition, the planarization layer 218 may have a contact hole 208 through which a portion of the drain electrode 217 is exposed.

The planarization layer 218 may include an insulator. For example, the planarization layer 218 may comprise an inorganic material, an organic material, or an organic/inorganic complex, have a single-layer or a multi-layer structure, and by various deposition methods. According to one or more embodiments, the planarization layer 218 may comprise one or more materials selected from the group consisting of polyacrylate resin, epoxy resin, phenolic resin, polyamide resin, polyimide resin, unsaturated polyester resin, polyphenylenether resin, polyphenylene sulfide resin, and benzocyclobutene (BCB).

However, the present embodiment is not limited to the structure described above, and the planarization layer 218 or the interlayer insulating layer 215 may be omitted according to circumstances.

The insulating layer 219 may comprise an inorganic material and/or an organic material. For example, the insulating layer 219 may include photoresist, an acrylic polymer, a polyimide polymer, a polyamide polymer, a siloxane polymer, a polymer containing a photosensitive acryl carboxyl group, novolac resin, alkali-soluble resin, silicon oxide, silicon nitride, silicon oxynitride, silicon oxycarbonate, silicon carbon nitride, Al, Mg, Zn, Hf, zirconium (Zr), Ti, Ta, aluminum oxide, titanium oxide, tantalum oxide, magnesium oxide, zinc oxide, hafnium oxide, zirconium oxide, or the like. According to one or more embodiments, the insulating layer 219 may include a single layer or layers of which an upper surface is planarized.

The organic light-emitting device OLED is disposed on the planarization layer 218 and the insulating layer 219 and includes a first electrode 221, an organic emission layer 220, and a second electrode 222. The pixel-defining layer 225 is disposed on the insulating layer 219 and the first electrode 221 and defines an emission area and a non-emission area.

The organic emission layer 220 may comprise a low- or high-molecular organic material. When a low-molecular organic material is used, a hole injection layer (HIL), a hole transport layer (HTL), an emission layer (EML), an electron transport layer (ETL), an electron injection layer (EIL), and the like may be stacked and formed in a single or complex structure. These low-molecular organic materials may be formed by a vacuum deposition method. In this case, the EML may be independently formed for each of red, green, and blue pixels, and the HIL, the HTL, the ETL, and the EIL are common layers and may be applied commonly to the red, green, and blue pixels.

When the organic emission layer 220 comprises a high-molecular organic material, the organic emission layer 220 may include only the HTL in a direction of the first electrode 221 from the EML. The HTL may be formed on the first electrode 221 by inkjet printing or spin coating by using poly-(2,4)-ethylene-dihydroxy thiophene (PEDOT), polyaniline (PANI), or the like. In this case, as usable organic materials, high-molecular organic materials of a poly(phenylene vinylene) (PPV) group, a polyfluorene group, and the like may be used, and a color pattern may be formed by a common method such as an inkjet printing method, a spin coating method, or a thermal transfer method using a laser.

The HIL may comprise a phthalocyanine compound, such as copper phthalocyanine, or a starburst-type amine derivative such as 4,4',4''-Tri(N-carbazolyl)triphenylamine (TCTA), 4,4',4''iTris(3-metholyphenyphenyl-amino)triphenylamine (m-MTDATA), or 1,3,5-tris[4-(3-methylphenyl-phenylamino)phenyl]benzene (m-MTDAPB).

The HTL may comprise N—N'-bis(3-methylphenyl)-N—N'-diphenyl-[1-1-biphenyl]-4,4'-diamine (TPD), N,N-Di (naphthalenel-yl)-N,N'-diphenyl-benzidine (NPD), or the like.

The EIL may be formed using a material such as lithium fluoride (LiF), sodium chloride (NaCl), cesium fluoride (CsF), lithium oxide (Li$_2$O), barium oxide (BaO), or lithium quinolinate (Liq).

The ETL may be formed using Liq$_3$.

The EML may include a host material and a dopant material.

The host material may be tris(8-hydroxyquinolinate)aluminum (Alq$_3$), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethyl-phenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-di-phenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The dopant material may be 4,4'-bis[4-(di-p-tolylamino) styryl]biphenyl (DPAVBi), 9,10-di(naph-2-thyl)anthracene (ADN), 3-tert-butyl-9,10-di(naph-2-thyl)anthracene (TBADN), or the like.

The first electrode 221 may be disposed on the planarization layer 218 and the insulating layer 219.

The first electrode 221 may be electrically connected to the drain electrode 217 of the thin-film transistor TR through the contact hole 208 penetrating through the planarization layer 218. Although FIGS. 1 to 4 show that the contact hole 208 is formed from a bottom surface of the insulating layer 219, the embodiments are not limited thereto.

The first electrode 221 may act as an anode electrode, and the second electrode 222 may act as a cathode electrode. However, the present embodiment is not limited thereto, and polarities of the first electrode 221 and the second electrode 222 may be exchanged.

When the first electrode 221 acts as an anode electrode, the first electrode 221 may include indium tin oxide (ITO), indium zinc oxide (IZO), zinc oxide (ZnO), indium oxide (In$_2$O$_3$), or the like having a high work function. When the organic light-emitting display apparatus 100 is a top emission type display apparatus in which an image is formed in an opposite direction of a substrate, the first electrode 221 may further include a reflective layer including Ag, Mg, Al, Pt, Pd, Au, Ni, Nd, Ir, Cr, Li, ytterbium (Yb), Ca, or the like. These materials may be used alone or in combination. Alternatively, the first electrode 221 may have a single-layer or multi-layer structure including a metal and/or an alloy described above. According to one or more embodiments, the first electrode 221 may include an ITO/Ag/ITO structure as a reflective electrode.

When the second electrode 222 acts as a cathode electrode, the second electrode 222 may comprise a metal such as Ag, Mg, Al, Pt, Pd, Au, Ni, Nd, Ir, Cr, Li, or Ca. If the organic light-emitting display apparatus 100 is a top emission type display apparatus, the second electrode 222 may be light-transmissible. According to one or more embodiments, the second electrode 222 may include ITO, IZO, ZnO, In$_2$O$_3$, or the like. According to another embodiment, the second electrode 222 may be formed as a thin film including at least one material selected from the group consisting of Li, Ca, LiF/Ca, LiF/Al, Al, Ag, Mg, and Yb. For example, the second electrode 222 may comprise Mg:Ag, Ag:Yb, and/or Ag in a single-layer or multi-layer structure. Unlike the first electrode 221, the second electrode 222 may be formed such that a common voltage is applied to all pixels.

The pixel-defining layer 225 is disposed on the insulating layer 219 and the first electrode 221 and may define an emission area and a non-emission area. The pixel-defining layer 225 may extend up to an upper surface of the insulating layer 219 while covering the first electrode 221 disposed on an inclined side wall of the insulating layer 219. The pixel-defining layer 225 may include an opening through which the first electrode 221 is exposed, and the opening may be the emission area. A height from a bottom surface of the opening to an upper surface of the pixel-defining layer 225 may be several µm, e.g., about 2 µm to about 5 µm.

The organic emission layer 220 may be disposed on the pixel-defining layer 225. In other words, the organic emission layer 220 may be disposed on the first electrode 221 in the opening and extend up to an upper part of the pixel-defining layer 225.

The pixel-defining layer 225 may comprise an organic material, an inorganic material, or the like. For example, the pixel-defining layer 225 may include an organic material, such as photoresist, polyacrylic resin, polyimide resin, or acrylic resin, or an inorganic material such as a silicon compound.

Figure 3:
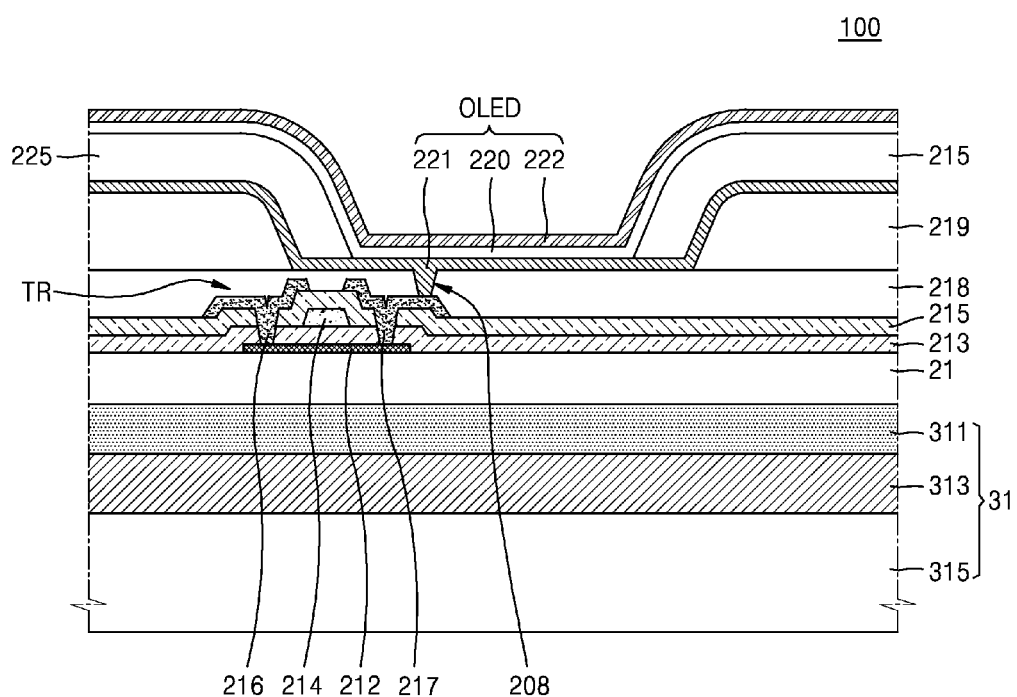
FIG. 3 illustrates a cross-sectional view of an organic light-emitting display apparatus according to another embodiment.

FIG. 3 illustrates a cross-sectional view of the organic light-emitting display apparatus 100 according to another embodiment.

Differences from the other embodiments of FIGS. 1 and 2 will be mainly described by omitting the description of the other portions of the organic light-emitting display apparatus 100 for convenience of description since the description of the other portions of the organic light-emitting display apparatus 100 is the same as described with reference to FIGS. 1 and 2.

As shown in FIG. 3, the flexible film 31 may further include an adhesive layer 311 on the second barrier layer 313.

The adhesive layer 311 may make the flexible film 31 adhere to the lower substrate 21 such that the flexible film 31 firmly adheres to the lower substrate 21. The adhesive layer 311 may include a permanent adhesive for permanently adhering between the flexible film 31 and the lower substrate 21. Alternatively, the adhesive layer 311 may include a temporary adhesive for temporarily adhering between the flexible film 31 and the lower substrate 21. However, a material of the adhesive layer 311 is not limited thereof.

The adhesive layer 311 may comprise a material having a function of preventing infiltration of moisture and oxygen. In this case, the second barrier layer 313 may primarily prevent infiltration of moisture and oxygen, and the adhesive layer 311 on the second barrier layer 313 may secondarily prevent infiltration of moisture and oxygen. Since the adhesive layer 311 has a function of preventing infiltration of moisture and oxygen, infiltration of moisture and oxygen is dually prevented by the adhesive layer 311 and the second barrier layer 313.

Therefore, the organic light-emitting display apparatus 100 according to the present embodiment may include the adhesive layer 311 comprising a material having a function of preventing infiltration of moisture and oxygen.

Figure 4:
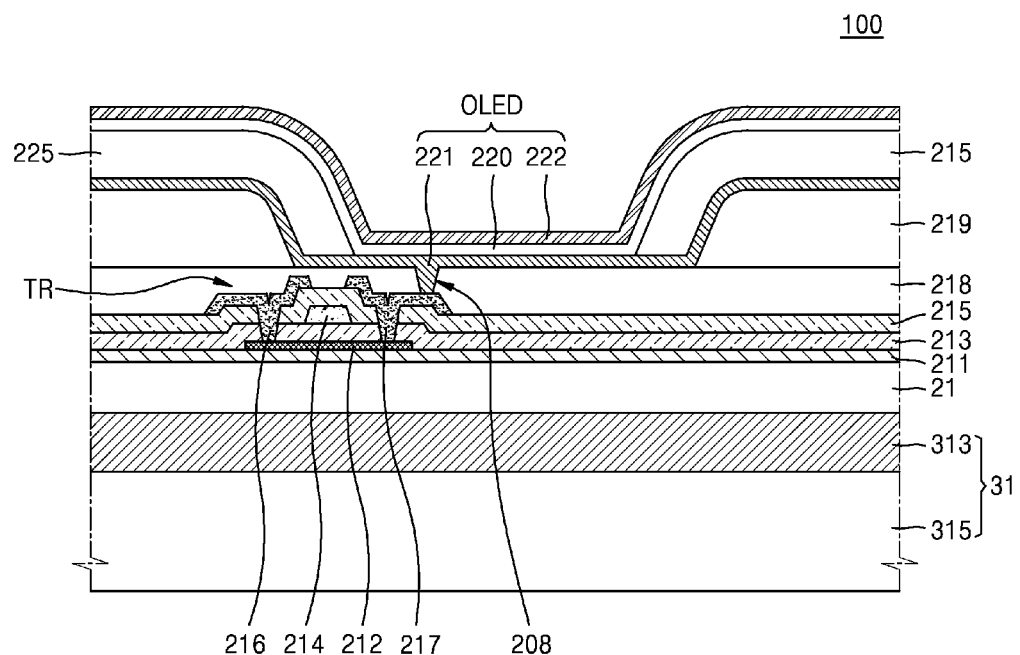
FIG. 4 illustrates a cross-sectional view of an organic light-emitting display apparatus according to another embodiment.

FIG. 4 illustrates a cross-sectional view of the organic light-emitting display apparatus 100 according to another embodiment.

The organic light-emitting display apparatus 100 according to the present embodiment may further include a first barrier layer 211 between the lower substrate 21 and the organic light-emitting device OLED, as shown in FIG. 4.

The first barrier layer 211 may prevent infiltration of oxygen and moisture and may comprise metal nitride, metal oxide, or a metal thin-film.

The organic light-emitting display apparatus 100 according to the present embodiment may primarily prevent infiltration of oxygen and moisture by the second barrier layer 313 included in flexible film 31 and secondarily prevent infiltration of oxygen and moisture by the first barrier layer 211 on the lower substrate 21.

By dually preventing infiltration of oxygen and moisture, a risk that the organic light-emitting device OLED is exposed to moisture and oxygen may be lowered, thereby preventing the organic light-emitting device OLED from being damaged.

As described above, the first barrier layer 211 may prevent the spread of impurity ions in the upper surface of the lower substrate 21, prevent infiltration of moisture and external air, and planarize a surface.

According to one or more embodiments, the first barrier layer 211 may comprise $AlO_x$, $TiO_x$, $SiO_x$, $AlN_x$, AlON, $TiN_x$, $TiON_x$, $SiN_x$, $SiON_x$, or the like. The first barrier layer 211 is not mandatory and may be omitted according to circumstances. The first barrier layer 211 may be formed by various deposition methods such as plasma-enhanced chemical vapor deposition (PECVD), atmospheric pressure CVD (APCVD), and low pressure CVD (LPCVD).

FIGS. 5A to 5D illustrate cross-sectional views for explaining a method of manufacturing the organic light-emitting display apparatus 100, according to an embodiment. Particularly, a method of manufacturing the organic light-emitting display apparatus 100 of FIG. 3 is described.

Figure 5A:
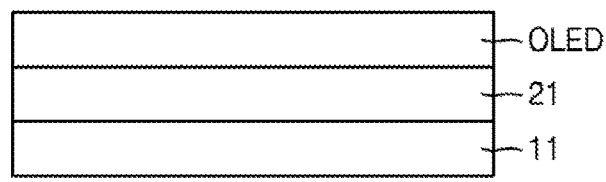
FIGS. 5A to 5D illustrate cross-sectional views of a method of manufacturing an organic light-emitting display apparatus, according to an embodiment.
Figure 5B:
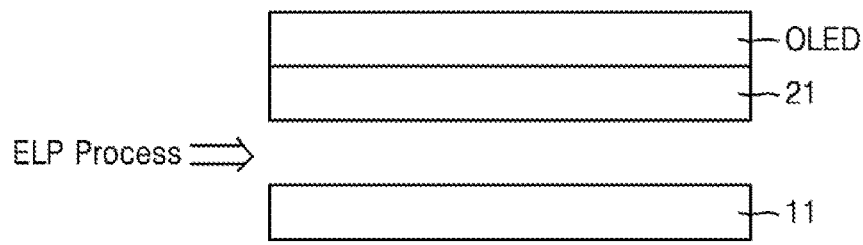

As shown in FIG. 5A, for the organic light-emitting display apparatus 100 according to the present embodiment, a mother substrate 11 is first prepared, and the lower substrate 21 and the organic light-emitting device OLED may be sequentially stacked on the mother substrate 11. The lower substrate 21 and the organic light-emitting device OLED are the same as described above with respect to the embodiments of the organic light-emitting display apparatus 100 and are not described again for convenience of description.

as shown in FIG. 5B, the mother substrate 11 may be separated from the lower substrate 21. In this case, an ELP process may be used.

The ELP process is a process of peeling a device off by irradiating an excimer laser beam, wherein, when an excimer laser beam irradiated from a glass side, the laser beam transmits through the glass and meets a polyimide (PI) substrate located at an opposite side.

Figure 5C:
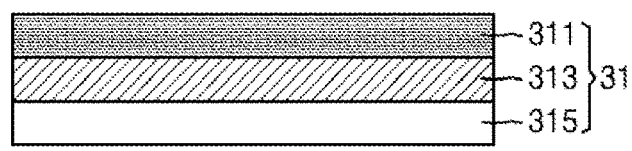

The PI substrate, on which the excimer laser beam is irradiated, is separated from the glass below the PI substrate. This is called an ELP process which may be commonly used in the art.

as shown in FIG. 5C, for the organic light-emitting display apparatus 100 according to the present embodiment, the base 315 may be prepared separately from the lower substrate 21. Thereafter, the flexible film 31 may be formed by sequentially stacking the second barrier layer 313 and the adhesive layer 311 on the base 315. The base 315, the second barrier layer 313, the adhesive layer 311, and the flexible film 31 are the same as described above with respect to the embodiments of the organic light-emitting display apparatus 100 and are not described again for convenience of description.

The second barrier layer 313 may be formed on the base 315 by being deposited by a PVD method, a CVD method, a wet thin-film forming method, or a sheet bonding process. The sheet bonding process is a process of bonding two layers by using an adhesive, and the second barrier layer 313 and the base 315 may be bonded together by an adhesive.

Figure 5D:
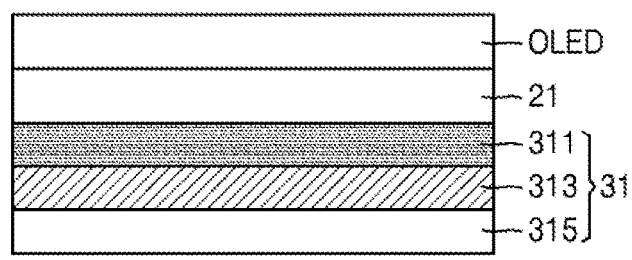

As shown in FIG. 5D, the flexible film 31 may be attached below the lower substrate 21, on which the organic light-emitting device OLED is stacked. By attaching the flexible film 31, including the second barrier layer 313, below the lower substrate 21, infiltration of moisture and oxygen from the outside may be effectively prevented. In addition, according to the method of manufacturing the organic light-emitting display apparatus 100, according to the present embodiment, the flexible film 31 attached below the lower substrate 21 has a moisture infiltration prevention function even without a separate substrate below the organic light-emitting device OLED, and thus, only the lower substrate 21 is provided below the organic light-emitting device OLED.

The components above are the same as described above with respect to the embodiments of the organic light-emitting display apparatus 100 and are not described again for convenience of description.

As described above, according to the one or more of the above example embodiments, there are advantageous effects.

It should be understood that the example embodiments described therein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
a lower substrate comprising a transparent plastic material;
an organic light-emitting device on the lower substrate; and
a flexible film below the lower substrate,
wherein the flexible film comprises:
a base; and
a second barrier layer provided on the base,
wherein the base comprises a polymer.

2. The organic light-emitting display apparatus of claim 1, wherein the second barrier layer comprises metal nitride, metal oxide, an inorganic material, or a metal thin-film.

3. The organic light-emitting display apparatus of claim 1, wherein the second barrier layer comprises at least two of metal nitride, metal oxide, an inorganic material, and a metal thin-film and comprises two or more thin-film layers.

4. The organic light-emitting display apparatus of claim 1, wherein the flexible film comprises an adhesive layer on the second barrier layer.

5. The organic light-emitting display apparatus of claim 4, wherein the adhesive layer comprises a permanent or temporary adhesive.

6. The organic light-emitting display apparatus of claim 1, further comprising a first barrier layer between the lower substrate and the organic light-emitting device.

7. The organic light-emitting display apparatus of claim 6, wherein the first barrier layer comprises metal nitride, metal oxide, an inorganic material, or a metal thin-film.

8. The organic light-emitting display apparatus of claim 7, wherein the first barrier layer comprises $AlO_x$, $TiO_x$, $SiO_x$, $AlN_x$, AlON, $TiN_x$, $TiON_x$, $SiN_x$, $SiON_x$, Al, Ti, Mo, Ag, Cu, Fe, Cr, Ni, Zn, or Sn.

9. The organic light-emitting display apparatus of claim 1, wherein the base comprises polyethylene terephthalate (PET), polyimide (PI), polycarbonate (PC), polyethylene naphthalate (PEN), or polyethersulfone (PES).

* * * * *